United States Patent [19]

Kinsman

[11] Patent Number: 5,030,934
[45] Date of Patent: Jul. 9, 1991

[54] CRYSTAL NOTCH FILTER COMPRISING DISCRETE QUARTZ CRYSTALS COUPLED TO A TRIMMABLE RC BRIDGING NETWORK

[75] Inventor: Robert G. Kinsman, Naperville, Ill.

[73] Assignee: Motorola, Inc., Schaumburg, Ill.

[21] Appl. No.: 375,757

[22] Filed: Jul. 5, 1989

[51] Int. Cl.[5] .......................................... H03H 9/205
[52] U.S. Cl. ....................................... 333/188; 333/189
[58] Field of Search ............... 333/170, 171, 174, 176, 333/188, 189, 190, 192

[56] References Cited

U.S. PATENT DOCUMENTS

| | | | |
|---|---|---|---|
| 1,977,751 | 10/1934 | Zobel | 333/170 |
| 2,248,776 | 7/1941 | Och | 333/188 |
| 4,028,647 | 6/1977 | Yee | 333/192 |
| 4,099,149 | 7/1978 | Yee | 333/192 |
| 4,246,554 | 1/1981 | Swanson et al. | 333/192 |
| 4,423,394 | 12/1983 | Kinsman | 333/192 |

FOREIGN PATENT DOCUMENTS

| | | | |
|---|---|---|---|
| 2145703 | 3/1973 | Fed. Rep. of Germany | 333/170 |
| 2423906 | 11/1975 | Fed. Rep. of Germany | 333/189 |
| 2425674 | 12/1975 | Fed. Rep. of Germany | 333/170 |

*Primary Examiner*—Eugene R. LaRoche
*Assistant Examiner*—Benny T. Lee
*Attorney, Agent, or Firm*—Wayne J. Egan

[57] ABSTRACT

An improved crystal notch filter is disclosed with a large passband-to-stopband ratio. The filter has individual sections with discrete crystal devices. In one embodiment as a 55 MHz trap, the filter has a passband from about 50 MHz to about 212 MHz with a 1 KHz stop band about a center frequency that may be tuned by means of a laser-trimmed bridging resistor.

4 Claims, 1 Drawing Sheet

CRYSTAL NOTCH FILTER COMPRISING DISCRETE QUARTZ CRYSTALS COUPLED TO A TRIMMABLE RC BRIDGING NETWORK

TECHNICAL FIELD

This application relates to stop band or notch filters and more particularly to notch filters that are implemented with discrete quartz crystal devices.

BACKGROUND OF THE INVENTION

In the communications industry there are many applications wherein it is necessary to transmit a wide frequency band of information or signals while virtually eliminating, or trapping, a narrow frequency band of signals. A type of filter for this purpose is known as a stop band filter. This filter is also known as a notch filter because of its well-known "plateau and valley" transfer characteristic. Such a characteristic, of course, is generally flat (the plateau portion) over all frequencies to be transmitted except that narrow frequency band to be eliminated, and it is here that the transfer characteristic falls off rapidly (the valley portion) on both sides of the center frequency ($f_c$) that identifies the center of the stop band, or notch.

This type of filter is particularly attractive for applications involving video or television broadcast signals where very wide passband bandwidths are needed. These video channels may include narrow bandwidth modulated carrier signals that must be trapped out to prevent video distortion. In addition, there are situations where interference may be caused by adjacent channel carrier frequencies or narrow band communication signals. A typical application for such trap filters is in CATV systems, wherein it is often necessary to transmit (or distribute) many broadcast channels in the presence of narrow-band noise such as an interfering signal.

Another notch filter application is to eliminate a carrier frequency signal that is used to scramble a television signal. The carrier would be inserted between the sidebands of the typical broadcast television video signal that are located at multiples of 15,750 Hz from the carrier. The filter must have minimum loss at the adjacent sidebands and should have a pass band extending across the VHF broadcast band.

It is known that one measure of quality of such notch filters is the ratio of the pass band—the frequency range or band of signals that are transmitted—to the stop band—the frequency band of signals blocked or trapped by the filter.

It is further known that quartz crystals are well suited for implementing such filters, due to their small size, excellent frequency stability, and low manufacturing costs. These crystals are passive components, and thus require no power. Moreover, a crystal notch filter with a high pass band-to-stop band ratio is very desirable for communication applications. In the past, ladder circuits using inductors in the series arms and crystals in the shunt arms have been used for such filters. However, these ladder circuits do not provide the wide pass band region that is desired. As a result, there is a need for an improved crystal notch filter.

SUMMARY OF THE INVENTION

It is an object of the invention to provide an improved crystal notch filter with a large pass band-to-stop band ratio. Accordingly, a crystal notch filter using discrete crystal devices is disclosed. In one particular implementation as a 55 MHz trap, the crystal notch filter has a pass band from about 50 MHz to about 212 MHz with a 1 KHz stop band about a 55 MHz center frequency that may be tuned by means of a laser-trimmed bridging resistor.

DETAILED DESCRIPTION OF THE INVENTION

Figure 1A:
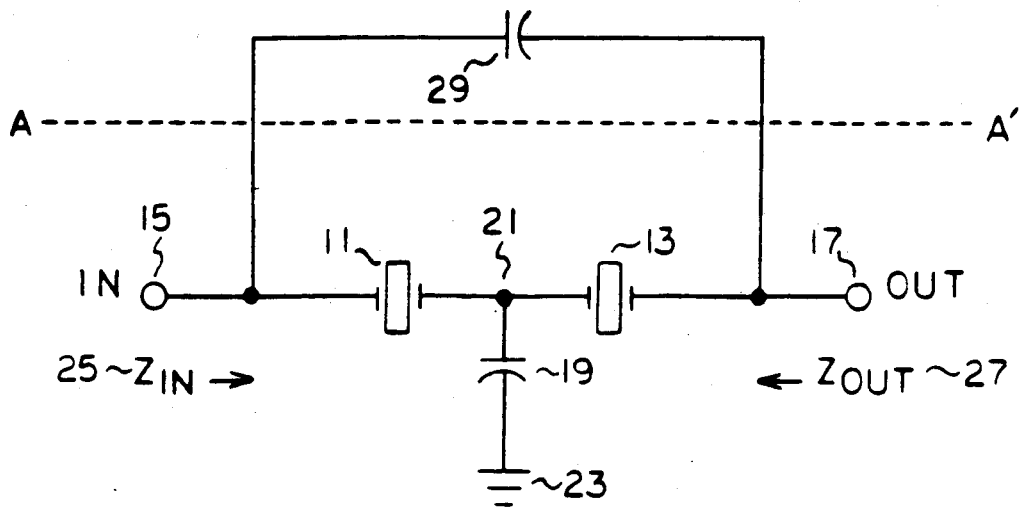
FIG. 1A is a circuit diagram that shows a first embodiment of an improved crystal notch filter, according to the invention.

FIG. 1A is a circuit diagram that shows a first embodiment of an improved crystal notch filter, according to the invention. Although FIG. 1A shows a filter with only one filter section, it will be appreciated that multiple sections may be cascaded for improved performance. In such an arrangement, each section would be similar to the section depicted in FIG. 1A.

As shown, the basic filter section consists of two identical discrete crystals 11 and 13 connected in series between an input terminal 15 and an output terminal 17. A coupling capacitor 19 connects the junction 21 of the two crystals to ground 23. Also, a bridging capacitor 29 connects the input 15 to the output 17. Those skilled in the art will appreciate that crystal 11 and crystal 13 are electrically coupled to each other by means of junction 21. Further, since crystals 11 and 13 are discrete units (as opposed to monolithic crystal filter elements), it will be appreciated that the acoustical coupling therebetween is nil. For and example of a filter using monolithic crystal filter elements, refer to my prior U.S. Pat. No. 4,423,394, which patent issued on Dec. 27, 1983 and is assigned to Motorola, Inc., the assignee of the present application.

Referring now to the filter section of FIG. 1A, the following relationships exist:

The input impedance ($Z_{in}$) 25 and output impedance ($Z_{out}$) 27 are set by the design bandwidth and the impedance of the crystals;

The frequency of the notch is determined by the crystal frequencies;

The depth of the notch is determined by the value of the bridging capacitor 29 and the quality factor (Q) of the crystals 11 and 13;

The bandwidth of the notch is determined by the value of the coupling capacitor 19; and, At frequencies away from the crystal resonances, the circuit is essentially a capacitor divider network, thus providing a very wide pass band region with a rolloff at the low frequency end.

In one particular implementation as a notch filter with a center frequency of 55 MHz, the filter may be built using third overtone crystals, each with a resonant frequency at 54.9975 MHz, a motional capacitance of $0.6 \times 10^{-15}$ F, a shunt capacitance of 1.5 pF, and a Q-factor of 40,000. For this implementation, the coupling capacitor 19 may be 6.6 pF and the bridging capacitor 19 may be 6.6 pF and the bridging capacitor 29 may be 5.6 pF. This yields an input and output impedance of about 320 ohms. The resulting filter section has a nominal passband insertion loss of 2.7 dB and provides a notch with a 3 dB bandwidth of 3.1 kHz and a 20 dB bandwidth of 600 Hz. The 3 dB passband extends from a low frequency of 27 Mhz to a high frequency of about 700 MHz. In prior crystal ladder filters using inductors in the series arms, on the other hand, a comparable filter would have a 3 dB passband extending to only about 85 MHz. Because an improved crystal notch filter, according to the invention, provides an extremely narrow notch bandwidth, it may be desirable to provide a method for trimming the notch frequency that can compensate for the frequency make tolerance of the crystals. This may be accomplished by combining the bridging capacitor 29 with an adjustable bridging resistor. There are at least two ways to do this, as shown in the following FIGS. 1B and 1C.

(FIGS. 1A, 1B, and 1C, the broken line A—A' is a reference line, with everything that appears below line A—A' being identical in each of the three figures.)

Figure 1B:
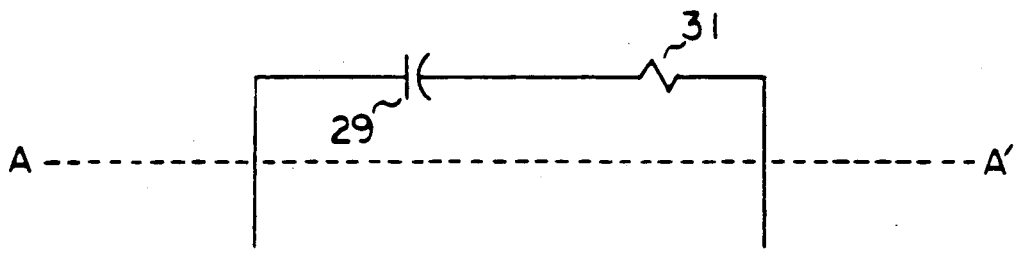
FIG. 1B shows a tuning option for the first embodiment.

Referring now to FIG. 1B, a bridging resistor 31 is connected in series with the bridging capacitor 29. For the previous 55 MHz notch filter implementation, the value of resistor 31 would be approximately 100 ohms.

Figure 1C:
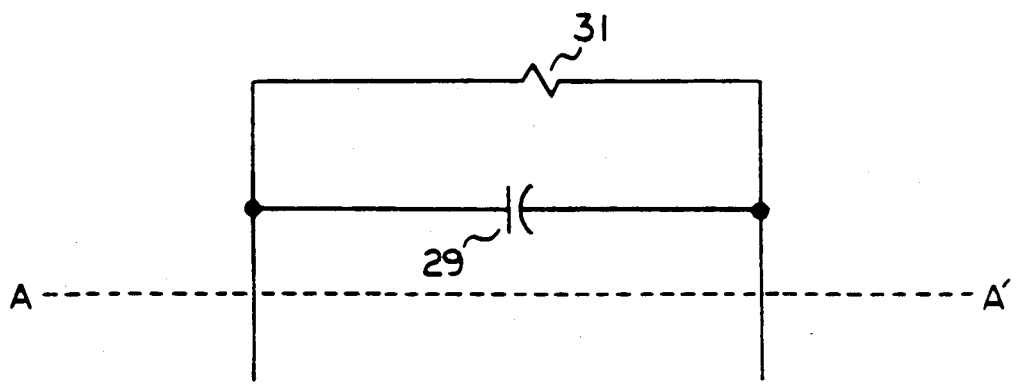
FIG. 1C shows an alternate tuning option for the first embodiment.

Referring now to FIG. 1C, the bridging resistor 31 is connected in parallel with the bridging capacitor 29. In this configuration, the prior 55 MHz trap filter would use a resistor 31 value of about 1000 ohms.

It is anticipated that in production the bridging resistors may be changed or adjusted by means of laser trimming. For example, in the series resistance configuration of FIG. 1B, a frequency shift of about 400 Hz in the notch may be obtained by changing the resistor from 10 to 100 ohms. For the parallel resistance configuration of FIG. 1C, changing the resistor from 1 Kohms to 10 Kohms causes the notch to shift about 800 Hz.

The crystal units themselves may be manufactured to a nominal frequency tolerance of $\pm 10$ ppm. Aging over a one-year period should be no more than $\pm 2$ ppm. The frequency drift over a temperature range of 15 to 45 degrees C. should be no more than $\pm 3$ ppm at the temperature extremes. By appropriate trimming of the trimming resistor 31, the filter response can be centered so that a minimum of 20 dB attenuation will be maintained at the desired frequency under all conditions of temperature and aging.

While various embodiments of an improved crystal notch filter, according to the present invention, have been described hereinabove, the scope of the invention is defined by the following claims.

What is claimed is:

1. A stop band filter section characterized by a center frequency and comprising:
   a first descrete quartz crystal device having two terminals and a second discrete quartz crystal device having two terminals, an input, an output, a bridging network having a first and second terminal respectively connected between said input and said output, a coupling capacitor having two terminals, one coupling capacitor terminal being grounded, and the other coupling capacitor terminal connected to one terminal of said first discrete quartz crystal device, said other coupling capacitor terminal further connected to one terminal of said second discrete quartz crystal device, another terminal of said first discrete quartz crystal device connected to said input, another terminal of said second discrete quartz crystal device connected to said output, wherein said bridging network includes a capacitor and a trimmable resistor connected in parallel with each other and in series with said bridging network first terminal and said bridging network second terminal, said trimmable resistor capable of being adjusted or changed by means of laser trimming to shift said center frequency and thus compensate for the frequency manufacturing tolerance of said discrete quartz crystal devices.

2. A stop band filter section characterized by a center frequency and comprising:
   a first discrete quartz crystal device having two terminals and a second discrete quartz crystal device having two terminals, an input, an output, a bridging network having a first and second terminal respectively connected between said input and said output, a coupling capacitor having two terminals, one coupling capacitor terminal being grounded, and the other coupling capacitor terminal connected to one terminal of said first discrete quartz crystal device, said other coupling capacitor terminal further connected to one terminal of said second discrete quartz crystal device, another terminal of said first discrete quartz crystal device connected to said input, another terminal of said second discrete quartz crystal device connected to said output, wherein said bridging network comprises a capacitor and a trimmable resistor connected in series with each other and in series with said bridging network first terminal and said bridging network second terminal, said trimmable resistor capable of being adjusted or changed by means of laser trimming to shift said center frequency and thus compensate for the frequency manufacturing tolerance of said discrete quartz crystal devices.

3. A notch filter characterized by a center frequency, a pass band, a stop band, a pass band insertion loss, a stop band insertion loss, an input impedance, and an output impedance, and having a filter input and a filter output and including a filter section, said filter section comprising:
   a common ground terminal, an input terminal connected in series with said filter input, an output terminal connected in series with said filter output,
   a first discrete quartz crystal device and a second discrete quartz crystal device;
   said first discrete quartz crystal device having a first terminal and a second terminal;
   said second discrete quartz crystal device having a first terminal and a second terminal;
   a bridging network having a first terminal and a second terminal;
   a coupling capacitor having a first terminal and a second terminal, said coupling capacitor first terminal connected to said common ground terminal;
   said first discrete quartz crystal device first terminal connected to said input terminal;
   said second discrete quartz crystal device first terminal connected to said output terminal;
   said coupling capacitor second terminal connected to said first discrete quartz crystal device second terminal and to said second discrete quartz crystal device second terminal;
   said bridging network first terminal connected to said input terminal;
   said bridging network second terminal connected to said output terminal;
   wherein said bridging network includes a capacitor and a resistor connected in series with each other and in series with said bridging network first terminal and said bridging network second terminal, said resistor capable of being changed or adjusted by means of laser trimming to shift said center frequency and thus compensate for the frequency manufacturing tolerance of said discrete quartz crystal devices.

4. A notch filter characterized by a center frequency, a pass band, a stop band, a pass band insertion loss, a stop band insertion loss, an input impedance, and an output impedance, and having a filter input and a filter output and including a filter section, said filter section comprising:

- a common ground terminal, an input terminal connected in series with said filter input, an output terminal connected in series with said filter ouput,
- a first discrete quartz crystal device and a second discrete quartz crystal device;
- said first discrete quartz crystal device having a first terminal and a second terminal;
- said second discrete quartz crystal device having a first terminal and a second terminal;
- a bridging network having a first terminal and a second terminal;
- a coupling capacitor having a first terminal and a second terminal, said coupling capacitor first terminal connected to said common ground terminal;
- said first discrete quartz crystal device first terminal connected to said input terminal;
- said second discrete quartz crystal device first terminal connected to said output terminal;
- said coupling capacitor second terminal connected to said first discrete quartz crystal device second terminal and to said second discrete quartz crystal device second terminal;
- said bridging network first terminal connected to said input terminal;
- said bridging network second terminal connected to said output terminal;

wherein said bridging network includes a capacitor and a resistor connected in parallel with each other and in series with said bridging network first terminal and said bridging network second terminal, said resistor capable of being changed or adjusted by means of laser trimming to shift said center frequency and thus compensate for the frequency manufacturing tolerance of said discrete quartz crystal devices.

* * * * *